(12) United States Patent
Machiya

(10) Patent No.: US 6,721,934 B2
(45) Date of Patent: Apr. 13, 2004

(54) IC ELEMENT LAYOUT DATA DISPLAY SYSTEM

(75) Inventor: Yuji Machiya, Tokyo-To (JP)

(73) Assignee: Dai Nippon Printing Co., Ltd. (JP)

( * ) Notice: Subject to any disclaimer, the term of this patent is extended or adjusted under 35 U.S.C. 154(b) by 25 days.

(21) Appl. No.: 09/985,117

(22) Filed: Nov. 1, 2001

(65) Prior Publication Data
US 2002/0053068 A1 May 2, 2002

(30) Foreign Application Priority Data
Nov. 2, 2000 (JP) ....................... 2000-336046

(51) Int. Cl.[7] .............................................. G06F 17/50
(52) U.S. Cl. .............................................. 716/11; 716/1
(58) Field of Search ......................... 716/11, 1

(56) References Cited

U.S. PATENT DOCUMENTS 6,493,858 B2 * 12/2002 Solomon ...................... 716/11

FOREIGN PATENT DOCUMENTS

JP 09-171525 6/1997

\* cited by examiner

Primary Examiner—Vuthe Siek
Assistant Examiner—Brandon Bowers
(74) Attorney, Agent, or Firm—Parkhurst & Wendell, L.L.P.

(57) ABSTRACT

An IC element layout data displaying system includes a magnetic disk unit for storing IC element layout data, and a preprocessor capable of reading the IC element layout data from the magnetic disk unit, of dividing the IC element layout data into a plurality of pattern sets each having an optional number of successive pieces of graphic information on the basis of the IC element layout data in the IC element layout data, and of generating map information including position information representing respective positions of pattern sets. A pattern retrieving unit accesses the IC element layout data by using the map information generated by the preprocessor to obtain graphic information corresponding a display area specified by an input unit. A display unit displays the graphic information retrieved by the pattern retrieving unit.

8 Claims, 6 Drawing Sheets

144d MAP INFORMATION

| PATTERN SET 1 |
|---|
| PATTERNS : 1~3 |
| AREA       : LOWER LEFT-HAND CORNER(0,0), UPPER RIGHT-HAND CORNER(1,1) |
| POSITIONS : START POINT 0, END POINT : 15 |
| PATTERN SET 2 |
| PATTERNS : 4~6 |
| AREA       : LOWER LEFT-HAND CORNER(1,1), UPPER RIGHT-HAND CORNER(2,2) |
| POSITIONS : START POINT 15, END POINT : 30 |
| ⋮ |

FIG.5

IC ELEMENT LAYOUT DATA DISPLAY SYSTEM

BACKGROUND OF THE INVENTION

1. Field of the Invention

The present invention relates to an IC element layout data display system for displaying IC element layout data, i.e., data on the layout of the elements of a large-scale integrated circuit (IC), and, more particularly, to an IC element layout data display system capable of displaying data on IC element layout in an enlarged or a reduced image to facilitate the visual examination and analysis of graphic information.

2. Description of the Related Art

Recent trend toward the functional advancement and dimensional reduction of electronic equipment requires further functional improvement and increase in the level of integration of various ICs represented by ASICs.

ICs, such as ASICs, are fabricated through many processes of fabricating semiconductor devices including a process of designing functions, logic, circuits and element layout, a process of producing graphic data for forming photomasks on the basis of the graphic data, processes of transferring the patterns of the photomasks to a wafer by a reduction projection exposure method or the like, and processes of forming semiconductor elements on the wafer.

Generally, the IC industry uses a stream format as a file format for IC element layout data in an IC designing process and a photomask forming process.

Data of the stream format is displayed on the screen of a display and is enlarged or reduced to examine the layout of the elements of an IC and to analyze defects in the IC.

When displaying the data of a stream format on the screen of a display, graphic information displayed in a display area is retrieved sequentially from the head to the tail of a file, and desired graphic information is displayed after retrieval all the data.

When enlarging or reducing an optional display area, desired graphic information is displayed after retrieval from the head to tail of the data.

When thus displaying graphic information about the layout of the elements of an IC, all the large-scale data is retrieved every time the display area is enlarged or reduced. However, the scale of data on the layout of the elements of LSI has been progressively increased and time necessary for displaying desired graphic information has been increased in proportion to the increase of the file size.

As the scale of the data on the layout of the elements of an IC increases progressively, time necessary for displaying graphic information about the lay out of the elements of an IC every time the display area is enlarged or reduced has increased beyond a practically tolerable limit, and the development of measures to reduce time necessary for displaying graphic information has been desired.

SUMMARY OF THE INVENTION

The present invention has been made in view of such problems and it is therefore an object of the present invention to provide an IC element layout data displaying system capable of displaying graphic information about IC element layout data of a large file size or displaying an enlarged or reduced display area in a short time regardless of file size.

According to the present invention, an IC element layout data displaying system includes an information recording unit for recording IC element layout data including a plurality of pieces of graphic information; a preprocessor capable of dividing the IC element layout data into a plurality of pattern sets each having an optional number of successive pieces of graphic information on the basis of the IC element layout data retrieved from the information recording unit so as to obtain map information including the plurality of pattern sets and position information corresponding to respective positions of pattern sets; an input unit for specifying an optional display area on the IC element layout data; a pattern retrieving unit capable of comparing the map information provided by the preprocessor and a display area specified by the input device and of specifying graphic information corresponding to the display area from the IC element layout data stored in the information recording unit; and a display unit for displaying the graphic information specified by the pattern retrieving unit.

In the IC element layout data displaying system according to the present invention, the preprocessor obtains map information having area information representing rectangular areas respectively including pattern sets.

In the IC element layout data displaying system according to the present invention, the preprocessor includes: a pattern set forming means for forming set information including a plurality of pattern sets each of an optional number of successive pieces of graphic information obtained by dividing the IC element layout data into a plurality of pattern sets, a pattern set area calculating means for obtaining area information representing rectangular areas respectively corresponding to the pattern sets, an in-file position finding means for obtaining position information representing position of each pattern set on the IC element layout data, and a map information generating means for generating map information on the basis of the set information provided by the pattern set forming means, the area information provided by the pattern set area calculating means, and the position information provided by the position finding means.

In the IC element layout data displaying system according to the present invention, the pattern retrieving unit includes a pattern retrieval range obtaining means for obtaining a pattern set corresponding to a display area by comparing the map information provided by the preprocessor and a display area specified by the input device, and obtaining retrieval range information including position information corresponding to a position of the pattern set, and a pattern retrieving means for retrieving graphic information corresponding to the display area from the IC element layout data by accessing the information recording unit on the basis of the retrieval range information provided by the pattern retrieval range obtaining means.

In the IC element layout data displaying system according to the present invention, the information recording unit is a magnetic disk unit.

In the IC element layout data displaying system according to the present invention, the information recording unit is capable of storing large-scale IC element layout data.

In the IC element layout data displaying system according to the present invention, the large-scale IC element layout data stored in the information recording unit includes the IC element layout data including more than several million transistors, and has a file size on the order of gigabytes.

In the IC element layout data displaying system according to the present invention, the pattern retrieving unit includes a pattern retrieval range obtaining means for obtaining a pattern set corresponding to a display area by comparing area information provided by the pattern set area calculating means of the preprocessor and display area specified by the input unit, and obtaining retrieval range information including position information corresponding to a position of the pattern set, and a pattern retrieving means for obtaining graphic data corresponding to the display area from the IC element layout data by accessing the information recording unit on the basis of the retrieval range information provided by the pattern retrieval range obtaining means.

The IC element layout data displaying system according to the present invention is capable of displaying graphic information about IC element layout data of a large file size or displaying an enlarged or reduced display area in a practically tolerable time regardless of file size.

The IC element layout data displaying system according to the present invention retrieves data on a specified display area from the IC element layout data and displays the same in a short time. Since map information on pattern sets is prepared beforehand by the preprocessor, the graphic data at a specific position in the IC element layout data can be retrieved on the basis of the map information and the retrieved graphic data is displayed. Since all the data does not need to be browsed, the data can be displayed in a practically tolerable predetermined time regardless of the size of the data.

The present invention is particularly effective when the scale of the IC element layout data is very large.

BRIEF DESCRIPTION OF THE DRAWINGS

FIG. 5 is a diagram of map information; and

DESCRIPTION OF THE PREFERRED EMBODIMENTS

Preferred embodiments of the present invention will be described with reference to the accompanying drawings.

Figure 1:
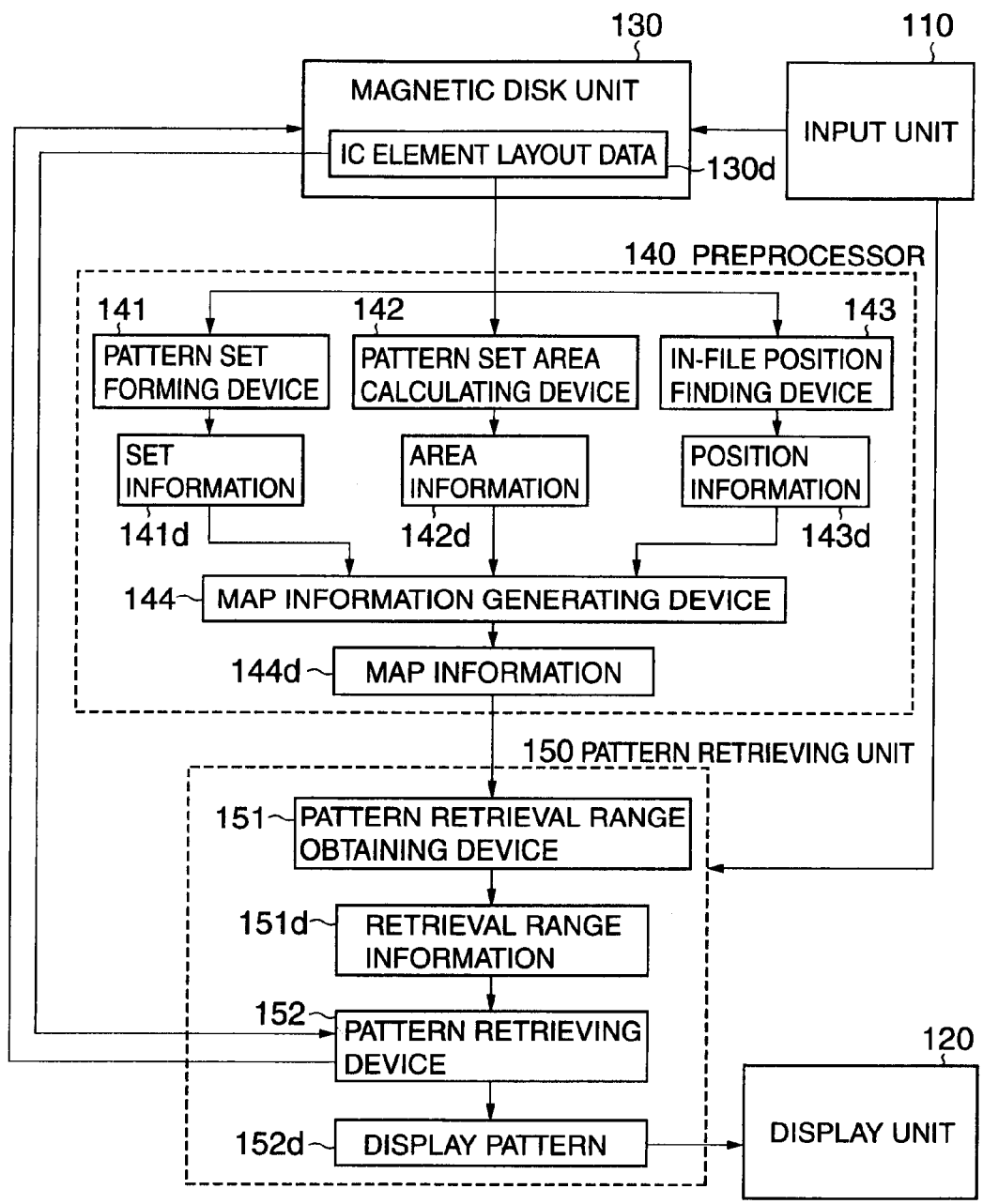
FIG. 1 is a block diagram of an IC element layout data displaying system in a preferred embodiment according to the present invention.
Figure 2:
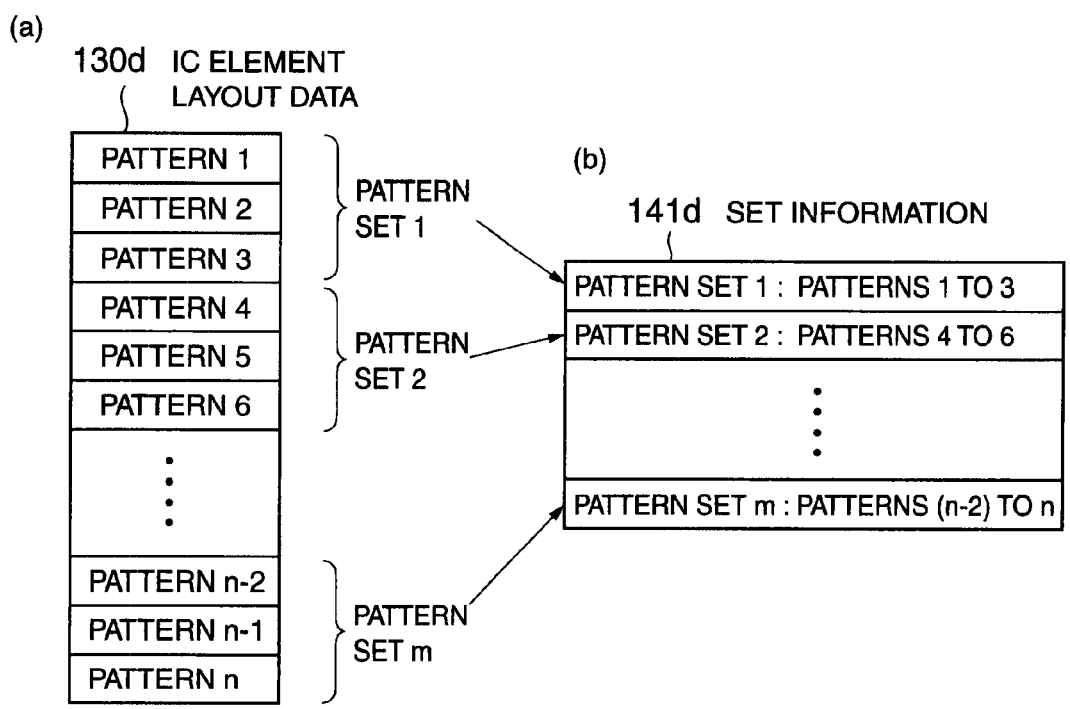
FIG. 2 is a diagrammatic view of assistance in explaining set information and a set information generating operation.
Figure 3:
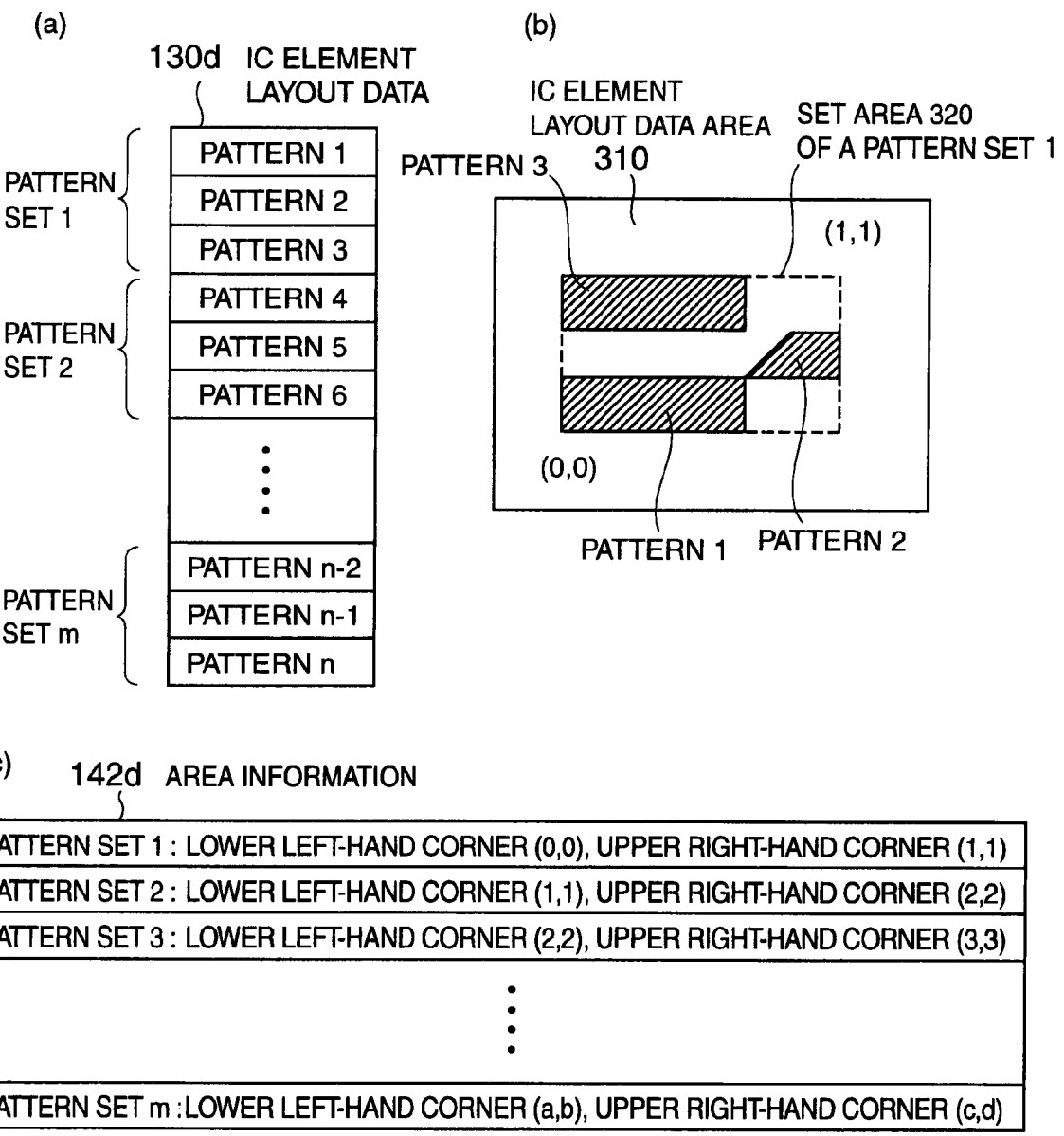
FIG. 3 is a diagrammatic view of assistance in explaining area information and an area information generating operation.
Figure 4:
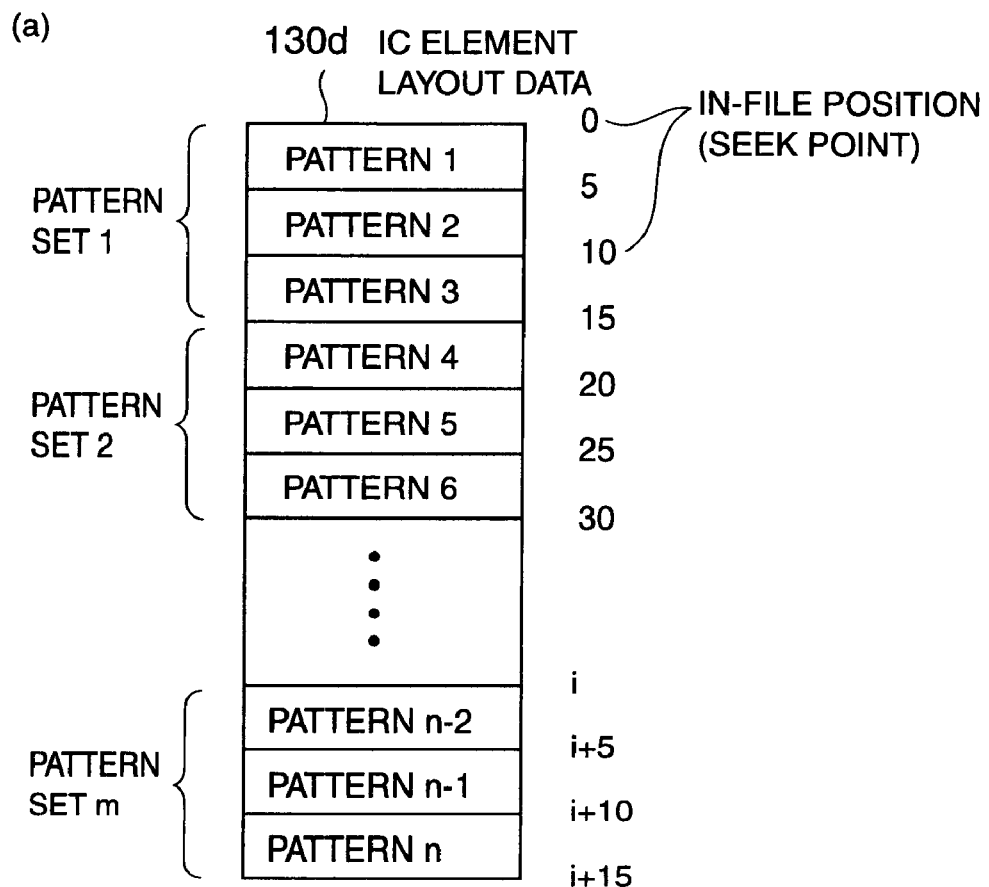
FIG. 4 is a diagrammatic view of assistance in explaining position information and a position information generating operation.
Figure 6:
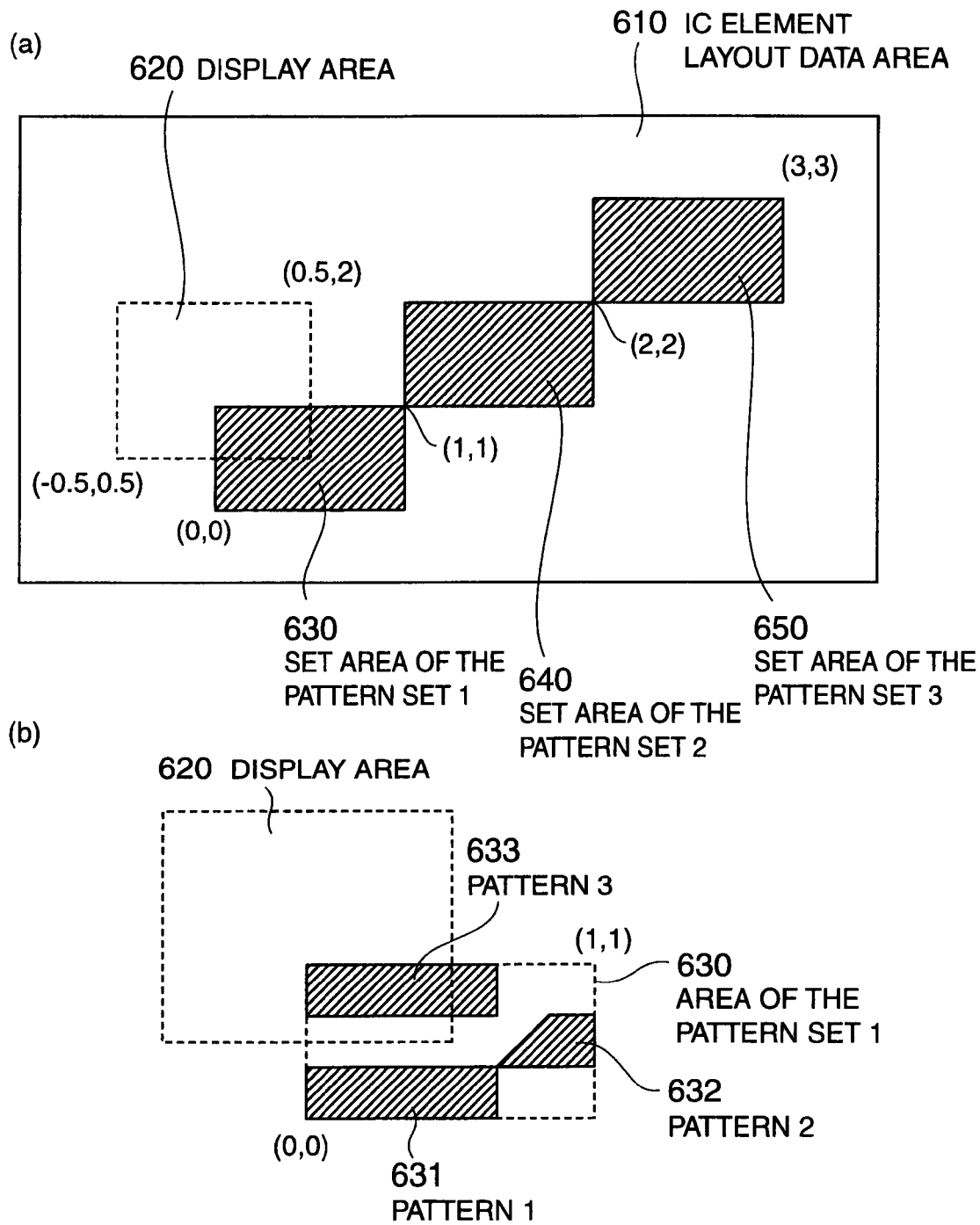
FIG. 6 is a diagrammatic view of assistance in explaining a displaying graphic data extracting operation by display area specification.

FIG. 1 is a block diagram of an IC element layout data displaying system in a preferred embodiment according to the present invention, FIG. 2 is a diagrammatic view of assistance in explaining set information and a set information generating operation, FIG. 3 is a diagrammatic view of assistance in explaining area information and an area information generating operation, FIG. 4 is a diagrammatic view of assistance in explaining position information and a position information generating operation, FIG. 5 is a diagram of map information; and FIG. 6 is a diagrammatic view of assistance in explaining a displaying graphic data extracting operation by display area specification.

Shown in FIGS. 1 to 6 are an input unit 110, a display 120, a magnetic disk unit 130, IC element layout data 130d, a preprocessor 140, a pattern set forming device (pattern set forming means) 141, set information 141d, a pattern set area calculating device (pattern set area calculating means) 142, area information 142d, an in-file position finding device (in-file position finding means) 143, position information 143d, map information generating device (map information generating means) 144, map information 144d, a pattern retrieving unit 150, a pattern retrieval range obtaining device (pattern retrieval range obtaining means) 151, retrieval range information (pattern retrieval range obtaining means) 151d, a pattern retrieving device (pattern retrieving means) 152, a display pattern 152d, a layout data area 310, a set area 320 of a pattern set 1, an IC element layout data area 610, a display area 620, a set area 630 of the pattern set 1, a set area 631 of a pattern 1, a set area 632 of a pattern 2, a set area 633 of a pattern 3, a set area 640 of a pattern set 2, and a set area 650 of a pattern set 3.

The IC element layout data displaying system of the present invention will be described with reference to FIG. 1.

The IC element layout data displaying system includes the a magnetic disk unit (information recording medium) 130 storing the IC element layout data 130d including a plurality of pieces of graphic information, and the preprocessor 140 capable of reading the IC element layout data 130d from the magnetic disk unit 130, and dividing the IC element layout data 130d into a plurality of pattern sets each having an optional number of successive pieces of graphic information to obtain the map information 144d including graphic information in the pattern set, set area information and position information corresponding to the graphic information in the pattern set on the data file of the IC element layout data 130d. The preprocessor 140 is connected to the pattern retrieving unit 150. The pattern retrieving unit 150 retrieves graphic information corresponding to an optional display area in the IC element layout data 130d by using the map information generated by the preprocessor 140. The pattern retrieving unit 150 is connected to the display 120 for displaying the retrieved graphic information, and to the input unit 110 which specifies the name of the IC element layout data to be displayed and specifies a display area in which an optional area on the IC element layout data is to be displayed in an enlarged or reduced image.

More specifically, the preprocessor 140 includes the pattern set forming device 141 which reads the IC element layout data 130d from the magnetic disk unit 130, divides the IC element layout data 130d into a plurality of pattern sets each of an optional number of successive pieces of graphic information in the data file of the IC element layout data 130d, and executes a set forming process to obtain the set information 141d to which graphic information included in each pattern set is assigned. The preprocessor 140 further includes the pattern set area calculating device 142 for obtaining the area information 142d about a set area, which is a rectangular area in the element layout data including all the graphic information in the pattern set, for each pattern set, and the in-file position finding device 143 which executes an in-file position finding process to provide each pattern set with the position information 143d specifying the position of the graphic information in the pattern set on the data file of the IC element layout data.

The preprocessor 140 further includes the map information generating device 144. The map information generating device 144 executes a map information generating process including the steps of collecting the set information 141d, the set area information 142d and the position information 143d respectively provided by the devices 141, 142 and 143 for each pattern set, and arranging the collected information in order to generate the map information 144d corresponding to the IC element layout data.

The display 120 displays pictures on the basis of the graphic information.

The input unit 110 includes, for example, a keyboard to be operated to enter the name of IC element layout data to be displayed, and a mouse for specifying an optional display area in an IC element layout.

The magnetic disk unit 130 stores the IC element layout data 130d in a data file of a stream format. The magnetic disk unit 130 provides pieces of graphic information one by one from a specified starting point in the data file until a piece of graphic information at a specified end point is provided when the retrieval range information 151d is specified.

When the retrieval range information is not specified, the magnetic disk unit 130 provides all the graphic information sequentially one by one from a piece of graphic information at the head of the data file to a piece of graphic information at the end of the data file.

The preprocessor 140 reads the IC element layout data 130d on a picture to be displayed from the magnetic disk unit 130 by the four devices 141 to 144, and provides the map information 144d. The pattern set forming device 141 reads pieces of graphic information in the IC element layout data 130d sequentially, counts the number of the pieces of graphic information, recognizes the pieces of graphic information to be a pattern set when the number of the pieces of graphic information coincides with a predetermined number, and generates set information.

The pattern set area calculating device 142 determines a minimum area (rectangular area) including all the graphic information , i.e., the components of each pattern set, i.e., X and Y coordinates of a lower left-hand corner and an upper right-hand corner of the rectangular minimum area on a plane coordinate system, and generates the area information 142d.

The in-file position finding device 143 determines the position of the first piece of the graphic information, i.e., the components of each pattern set and the position of the last piece of the graphic information of the pattern set on the basis of length from the head of the file of the IC element layout data 130d to generate the position information 143d corresponding to the start and the end point of the pattern set on the IC element lay out data 130d.

The map information generating device 144 collects and arranges the set information 141d, the set area information 142d and the position information 143d respectively provided by the devices 141, 142 and 143 for each pattern set in order to generate the map information 144d.

The pattern retrieving unit 150 specifies a pattern set corresponding to a display area on the basis of the display area specified by the input unit 110 and the map information 144d by using the pattern retrieval range obtaining device 151 and the pattern retrieving device 152. The pattern retrieving unit 150 receives graphic information corresponding to the specified pattern set and extracts the display pattern 152d from the IC element layout data 130d and gives the same to the display 120.

The pattern retrieval range obtaining device 151 of the pattern retrieving unit 150 receives the display area from the input unit 110, recognizes the display area in the IC element layout data 130d, and searches the map information 144d for a pattern set overlapping the display area. The pattern retrieval range obtaining device 151 provides the retrieval range information 151d specifying the start and the end point of graphic data retrieval from the position information 144d on the pattern set obtained through searching.

The pattern retrieving device 152 gives graphic information corresponding to the display pattern 152d to the display 120.

The operations of the IC element layout data display system will be described hereinafter.

It is supposed, to facilitate understanding, that the magnetic disk unit 130 stores IC element layout data 130d including the graphic information of n patterns (pieces of graphic information), i.e., a pattern 1 to a pattern n, one pattern set includes the three patterns, a display area in which the pattern set is to be displayed is specified, and the display 120 displays only the patterns in the display area of the IC element layout data 130d.

The input unit 110 specifies the data name of the IC element layout data 130d to be processed, and specifies a process. Then, the pattern set forming device 141 of the preprocessor 140 reads the pieces of the graphic information provided by the magnetic disk unit 130 one by one and generates the set information 141d including pattern sets each consisting of three patterns.

The IC element layout data 130d has file structure as shown in FIG. 2(a). In the file structure, each pattern set includes three patterns. For example, the pattern set 1 includes the patterns 1 to 3, and the pattern set 2 includes the patterns 4 to 6.

The pattern set forming device 141 generates the set information 141d of file structure shown in FIG. 2(b).

At the same time, the pattern set area calculating device 142 calculates an area for each pattern set on the basis of the patterns included in the pattern set to generate the area information 142d.

The patterns (pieces of graphic information) represented by the IC element layout data are divided into the pattern sets as shown in FIG. 3(a). FIG. 3(b) shows an area for the three patterns of the pattern set 1. As shown in FIG. 3(b), a minimum area (rectangular area) including the patterns 1 to 3 is a set area 320 for the pattern set 1.

The set area 320, the rectangular area indicated by dotted lines in FIG. 3(b), is defined by a lower left-hand corner represented by coordinates (0,0) and an upper right-hand corner represented by coordinates (1, 1).

The area information 142d has file structure as shown in FIG. 3(c).

As shown in FIG. 4(a), in-file positions (seek points) are attached to the data file containing the IC element layout data 130d to provide each of the pieces of the graphic information with position information representing the position of the pattern on the data file. The in-file position finding device 143 generates the position information 143d representing the position of each pattern set in the data file structure on the data file as shown in FIG. 4(b) on the basis of the position information corresponding to each piece of graphic information.

As shown in FIG. 4(a), in the pattern set 1, the head of the pattern 1 is at a position 0, and the end of the pattern 3 is at a position 15. Thus, the starting and the end position of the pattern set 1 are at the positions 0 and 15, respectively.

Similarly, the starting and the end positions of the pattern set 2 are at the positions 15 and 30, respectively. The starting and the end positions of the pattern set m are at positions i and i+15, respectively.

Thus, the position information 143d including the data on the respective starting and end positions of the pattern sets is obtained for each pattern set.

The map information generating device 144 generates the map information 144d shown in FIG. 5 for the file structure by collecting the set information 141d, the area information 142d and the position information 143d for each pattern set on the basis of the set information 141d, the area information 142d and the position information 143d provided, respectively, by the pattern set forming device 141, the pattern set area calculating device 142 and the in-file position finding device 143.

The pattern retrieving unit 150 searches the IC element layout data 130d for a display pattern corresponding to the specified display area.

When the input unit 110 specifies the display area 620, the pattern retrieval range obtaining device 151 of the pattern retrieving unit 150 compares the display area 620 and the map information 144d to determine the retrieval range information 151d.

The display area 620 is defined by coordinates representing an optional rectangular area on the IC element layout data 130d.

More specifically, the pattern retrieval range obtaining device 151 compares the display area 620 and the area information 142d of the map information 144d for each pattern set, and obtains the pattern set corresponding to the display area 620.

An operation for displaying only patterns contained in the display area 620 defined by points represented by coordinates (−0.5, 0.5) and (0.5, 2) will be described to facilitate understanding.

The pattern retrieval range obtaining device 151 compares the display area 620 and the area information 142d (FIG. 3(c)) of the map information 144d to retrieve a pattern set corresponding to the display area 620.

As shown in FIG. 6(a), the display area 620 overlaps the set area 630 of the pattern set 1.

Thus, it is known from the map information 144d that a pattern retrieval range in the IC element layout data 130d is between a start point 0 to an end point 15; that is, the retrieval range information 151d indicates that the retrieval range is between the start point 0 and the end point 15 in the file of the IC element layout data 130d.

Subsequently, the pattern retrieving device 152 specifies the display pattern 152d. The pattern retrieving device 152 accesses the magnetic disk unit 130 and reads pieces of graphic information in the range of the start point 0 to the end point 15 in the data file one by one on the basis of the retrieval range information 151d.

When the pieces of the graphic information are thus read repeatedly, only a piece of the graphic information overlapping the display area 620 is extracted, and the extracted piece of the graphic information is displayed on the screen of the display unit 120.

When the pattern set 1 includes the patterns (pieces of graphic information) 1 to 3 shown in FIG. 3(b), only the pattern 3 (633) is contained in the display area 620 as shown in FIG. 6(b), and only the graphic information representing the pattern 3 (633) contained in the display area 620 is given to the display unit 120.

As apparent from the foregoing description, according to the present invention, the graphic information included in the IC element layout data can be displayed on the screen of the display unit regardless of file size even if the file size of the IC element layout data is very large, and the display area can be enlarged or reduced in a practically tolerable time.

What is claimed is:

1. An IC element layout data displaying system comprising:

an information recording unit for recording IC element layout data including a plurality of pieces of graphic information;

a preprocessor capable of dividing the IC element layout data into a plurality of pattern sets, each having an optional number of successive pieces of graphic information on the basis of the IC element layout data retrieved from the information recording unit so as to obtain map information including the plurality of pattern sets and position information corresponding to respective positions of pattern sets;

an input unit for specifying an optional display area on the IC element layout data;

a pattern retrieving unit capable of comparing the map information provided by the preprocessor and a display area specified by the input unit and of specifying graphic information corresponding to the display area from the IC element layout data stored in the information recording unit; and a display unit for displaying the graphic information specified by the pattern retrieving unit.

2. The IC element layout data displaying system according to claim 1, wherein the preprocessor obtains map information having area information representing rectangular areas respectively including pattern sets.

3. The IC element layout data displaying system according to claim 2, wherein the preprocessor includes:

a pattern set forming means for forming set information including a plurality of pattern sets, each of an optional number of successive pieces of graphic information obtained by dividing the IC element layout data into a plurality of pattern sets, a pattern set area calculating means for obtaining area information representing rectangular areas respectively corresponding to the pattern sets, an inf-file position finding means for obtaining position information representing the position of each pattern set on the IC element layout data, and a map information generating means for generating map information on the basis of the set information provided by the pattern set forming means, the pattern area information provided by the set area calculating means, and the position information provided by the position finding means.

4. The IC element layout data displaying system according to claim 3, wherein the pattern retrieving unit includes:

a pattern retrieval range obtaining means for obtaining a pattern set corresponding to a display area by comparing area information provided by the pattern set area calculating means of the preprocessor and display area specified by the input unit, and obtaining retrieval range information including position information corresponding to a position of the pattern set, and a pattern retrieving means for obtaining graphic data corresponding to the display area from the IC element layout data by accessing the information recording unit on the basis of the retrieval range information provided by the pattern retrieval range obtaining means.

5. The IC element layout data displaying system according to claim 1, wherein the pattern retrieving unit includes:

a pattern retrieval range obtaining means for obtaining a pattern set corresponding to a display area by comparing the map information provided by the preprocessor and a display area specified by the input device, and obtaining retrieval range information including position information corresponding to a position of the pattern set, and a pattern retrieving means for obtaining graphic information corresponding to the display area from the IC element layout data by accessing the information recording unit on the basis of the retrieval range information provided by the pattern retrieval range obtaining means.

6. The IC element layout data displaying system according to claim 1, wherein the information recording unit is a magnetic disk unit.

7. The IC element layout data displaying system according to claim 1, wherein the information recording unit is capable of storing large-scale IC element layout data.

8. The IC element layout data displaying system according to claim 7, wherein the large-scale IC element layout data stored in the information recording unit includes the IC element layout data including more than several million transistors, and The has a file size on the order of gigabytes.

* * * * *